US011476150B2

(12) United States Patent
Jung et al.

(10) Patent No.: US 11,476,150 B2
(45) Date of Patent: Oct. 18, 2022

(54) SPUTTERING PROCESSING AND APPARATUS

(71) Applicant: Rokko Systems Pte Ltd, Singapore (SG)

(72) Inventors: Jong Jae Jung, Singapore (SG); Yun Suk Shin, Singapore (SG); Deok Chun Jang, Singapore (SG)

(73) Assignee: Rokko Systems PTE LTD, Singapore (SG)

( * ) Notice: Subject to any disclaimer, the term of this patent is extended or adjusted under 35 U.S.C. 154(b) by 223 days.

(21) Appl. No.: 16/795,710

(22) Filed: Feb. 20, 2020

(65) Prior Publication Data

US 2020/0286771 A1    Sep. 10, 2020

(30) Foreign Application Priority Data

Mar. 4, 2019 (SG) .......................... 10201901908X

(51) Int. Cl.
*H01L 21/683* (2006.01)
*C23C 14/50* (2006.01)
*C23C 14/34* (2006.01)

(52) U.S. Cl.
CPC .......... *H01L 21/6836* (2013.01); *C23C 14/34* (2013.01); *C23C 14/50* (2013.01); *H01L 2221/6835* (2013.01)

(58) Field of Classification Search
CPC ......... H01L 21/6836; H01L 2221/6835; H01L 2221/68313; H01L 2221/6834; H01L 21/67011; C23C 14/34; C23C 14/50
See application file for complete search history.

(56) References Cited

U.S. PATENT DOCUMENTS

2017/0162412 A1* 6/2017 Baek ................... H01L 21/6835

FOREIGN PATENT DOCUMENTS

WO    WO-2016013981 A1 *  1/2016  ............... B23Q 3/08

* cited by examiner

*Primary Examiner* — Jennifer Wecker
*Assistant Examiner* — Patrick S Ott
(74) *Attorney, Agent, or Firm* — Standley Law Group LLP; Jeffrey S. Standley; Stephen L. Grant

(57) ABSTRACT

A process for sputtering a plurality of integrated circuit ("IC") units, the process having at least the steps of: applying a layer to a holding ring; cutting an array of apertures in the layer; transferring the holding ring to a template positioned within a placement station; aligning the array of apertures with an array of recesses in the template; delivering IC units to the holding ring, each IC unit corresponding to an aligned aperture and recess, and then; applying a sputtering process to the IC units engaged with the holding ring.

11 Claims, 7 Drawing Sheets

SPUTTERING PROCESSING AND APPARATUS

TECHNICAL FIELD

The invention relates to the processing of integrated circuit (IC) units and in particular methods and apparatus to assist in the sputtering of ball grid array (BGA) IC units.

BACKGROUND

Sputtering to deposit thin films of materials on IC units is an efficient method of applying materials having very high melting points. Thus, sputtering has become widely used given its flexibility for the materials to be applied.

Typically, an array of IC units are placed upon a substrate and passed through a sputtering chamber to receive the thin material layer.

In so doing, the IC units are supported by a stencil adhesively bonded to a ring with double-sided tape. The double-sided tape is laser cut, with the IC units fitting within apertures created by said laser cut. The stencil with the IC units is then offloaded and sent for sputtering. The units are subsequently ejected and offloaded from the system.

The use of stencils, however, is uneconomic in that they are expensive to manufacture and difficult to recycle following the sputtering step. Consequently, some prior art systems omit the stencil with the IC units placed directly on the tape. The difficulty in using tape without a stencil support is the flexibility of the tape tending to misalign the units as well as lacking sufficient support during transport.

SUMMARY OF INVENTION

In a first aspect the invention provides a process for sputtering a plurality of IC units, the process comprising the steps of: applying a layer to a holding ring; cutting an array of apertures in the layer; transferring the holding ring to a template positioned within a sputtering station; aligning said array of apertures with an array of recesses in said template; delivering IC units to said holding ring, each IC unit corresponding to an aligned aperture and recess, and then; applying a sputtering process to said IC units engaged with said holding ring.

In a second aspect the invention provides a placement station comprising: a template having an array of recesses; said template arranged to receive a holding ring having an array of apertures; said apertures and recesses arranged to align so as to receive a plurality of IC units for sputtering.

Therefore with the invention providing a template mounted or unitarily positioned within the sputtering table, structural support for the IC units during sputtering is maintained without the additional cost of manufacturing single use stencils.

The IC units may be engaged with a layer bonded to a holding ring, and sputtered whilst on said layer.

BRIEF DESCRIPTION OF DRAWINGS

It will be convenient to further describe the present invention with respect to the accompanying drawings that illustrate possible arrangements of the invention. Other arrangements of the invention are possible and consequently, the particularity of the accompanying drawings is not to be understood as superseding the generality of the preceding description of the invention.

DETAILED DESCRIPTION

The invention therefore provides a reusable template having an array of apertures corresponding to IC units. The process begins with the units being inspected, flipped, aligned and oriented. The inspection, alignment and orientation step include conducting a top vision inspection then moving the units to a flipper and subsequently a picker for aligning the units. By having the template fixed to the sputtering table, IC units are delivered directly to the sputtering table to position on a laser cut tape, bonded to a holding ring, which in turn is placed on the template. Following the sputtering process, the units are ejected, aligned and further inspected before being offloaded.

Figure 1A:
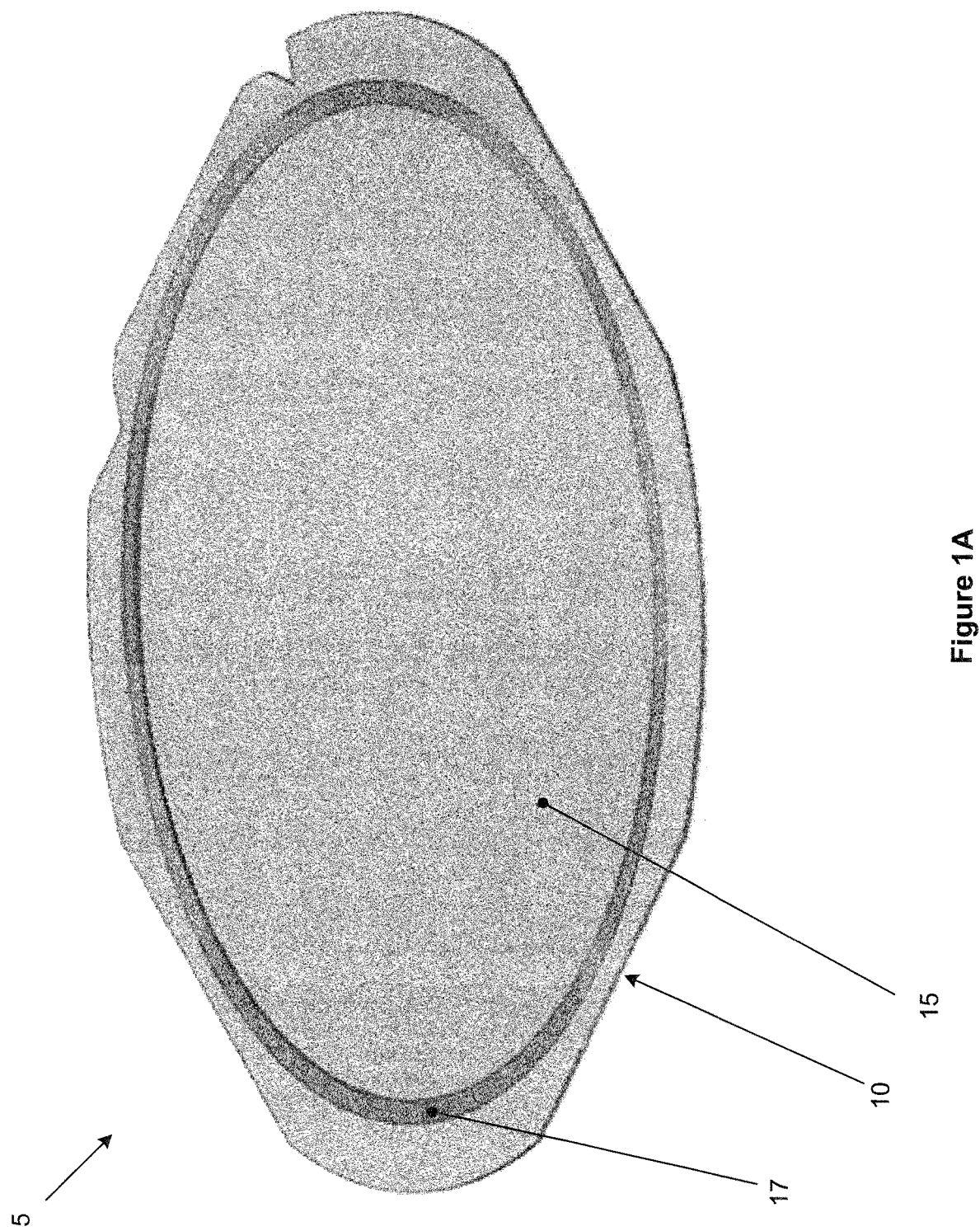
FIGS. 1A and 1B are sequential views of the application of layer to a holding ring according to one embodiment of the present invention.
Figure 1B:
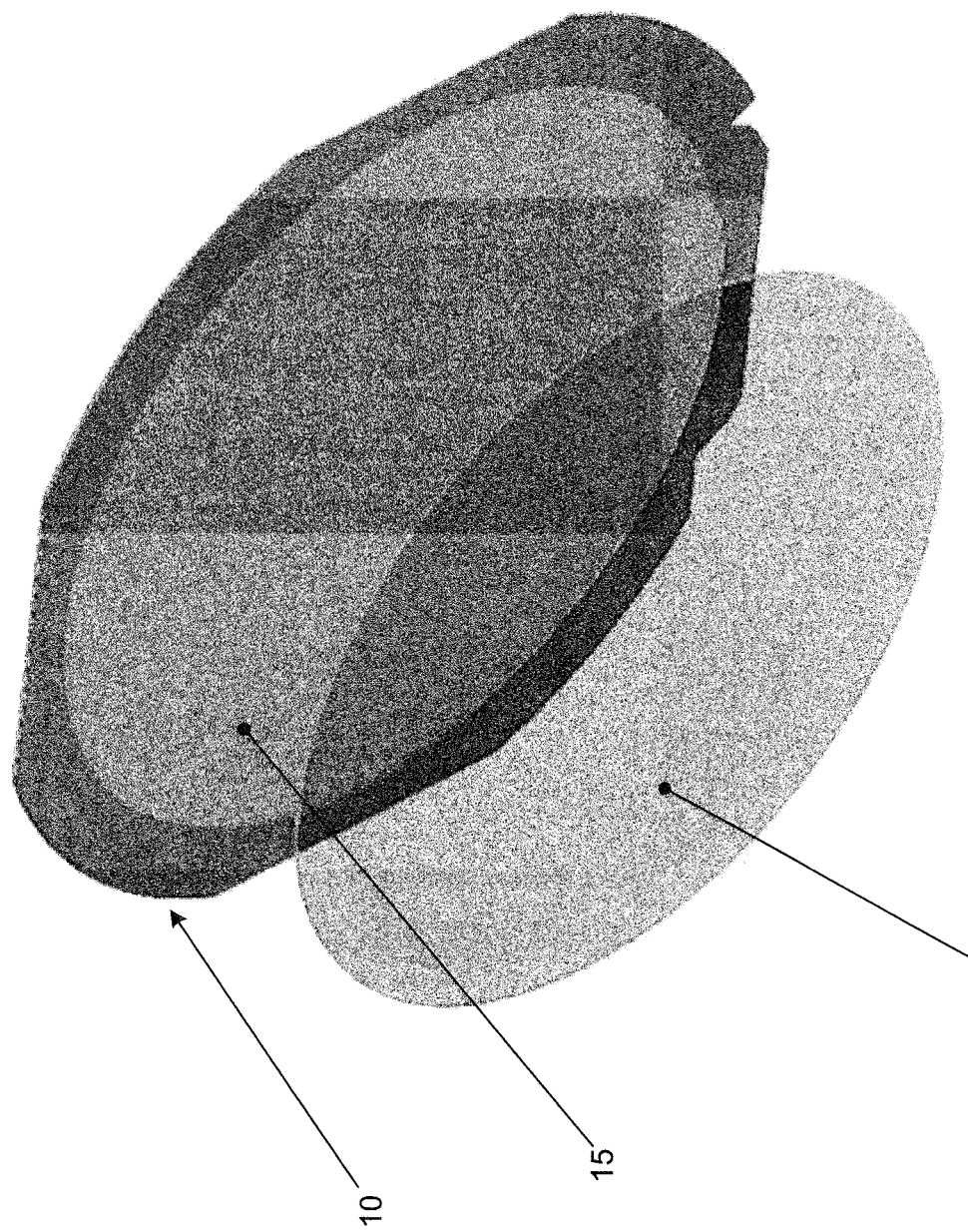

FIGS. 1A and 1B show the preparation 5 of a holding ring 10 prior to laser cutting of the apertures. The ring 10 receives a double-sided sputtering tape 15 covering the void in the ring 10. The sputtering tape 15 may be an adhesive layer applied to the holding ring. A lower layer, such as a sub-tape 20 is then attached underneath the tape 15 so as to cover any adhesive backing of the sputtering tape 15. Because the stencil of the prior art is affixed to the sputtering tape 15, the adhesive areas not cut are then covered. However, given the removal of the stencil from the process a lower layer, such as a sub-tape 20 is used as a cover for this adhesive section.

It will be appreciated that a layer having a peripheral adhesive portion sufficient to stick to the holding ring 10 may also be used such that the sub-tape 20 is not required. A peripheral section 17 as shown in FIG. 1A is required to stick to the ring 10. However, in this separate embodiment, no further adhesive quality is required of the peripheral adhesive layer.

Figure 2A:
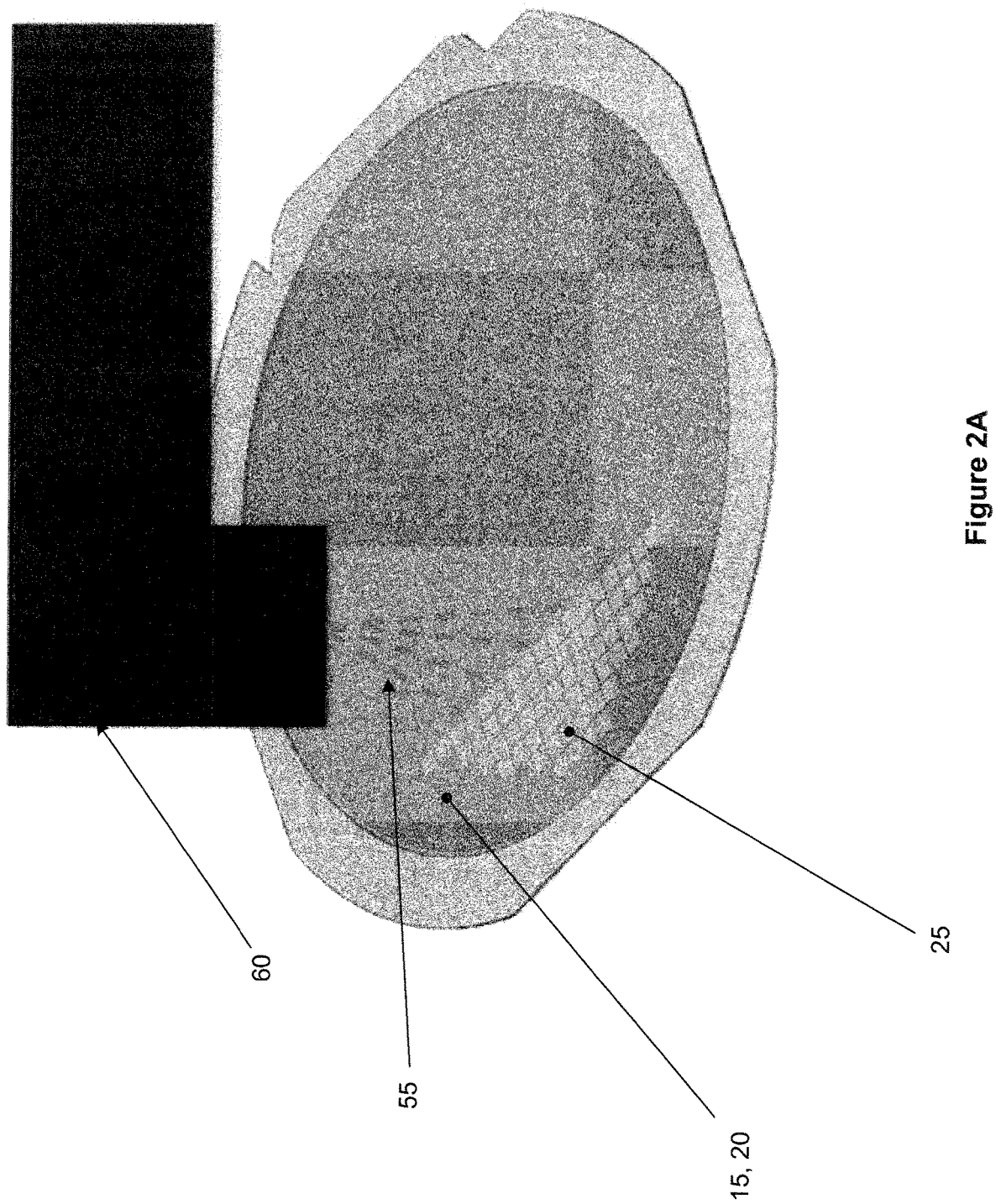
FIGS. 2A and 2B are sequential views of the laser cutting process according to a further embodiment of the present invention.
Figure 2B:
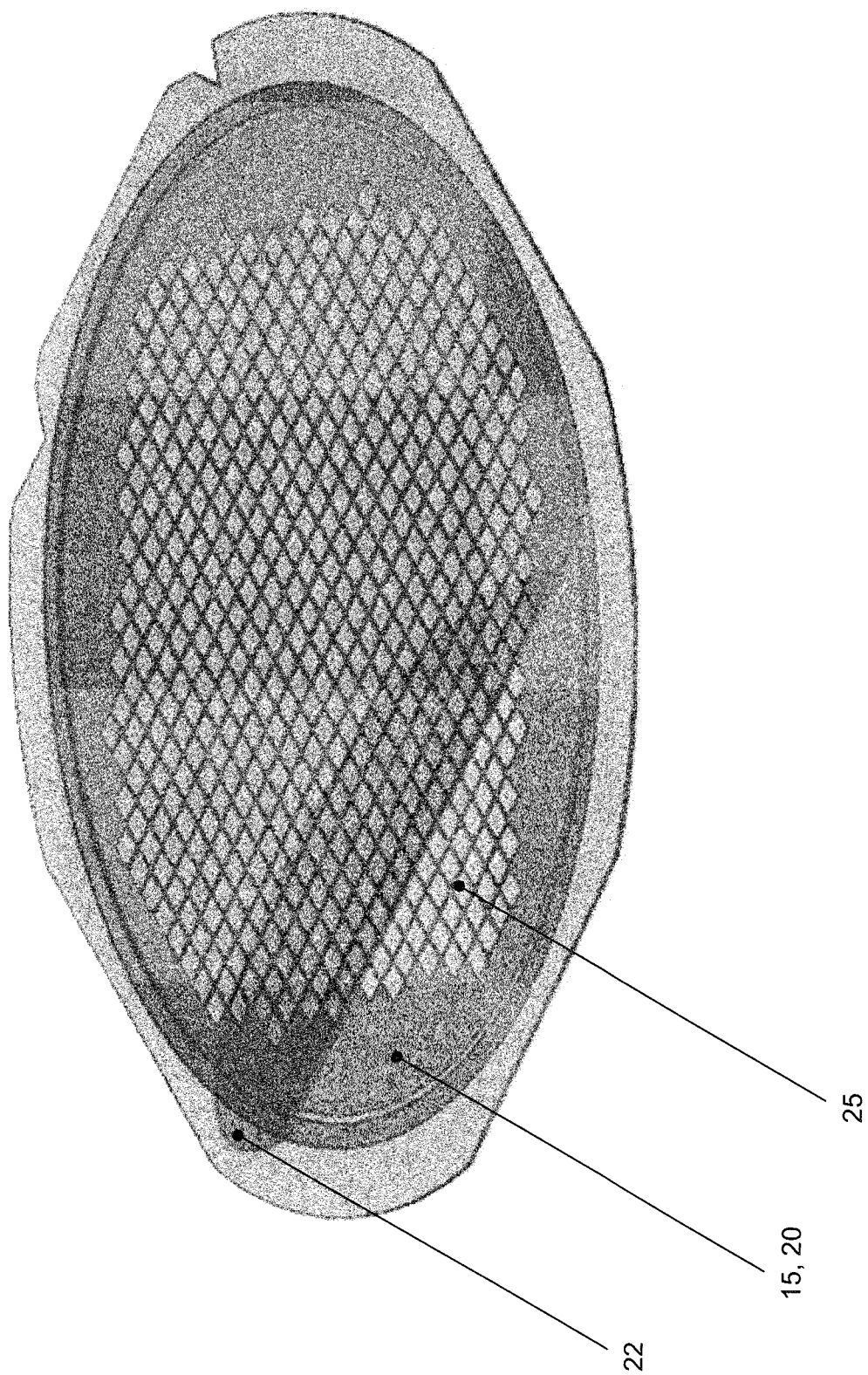

FIGS. 2A and 2B correspond to the laser cutting process 55 whereby a laser cutter 60 cuts apertures in the sputtering tape 15 and the sub-tape 20 in order to create an array of apertures 25 for receiving the IC units. Once the array of apertures 25 is cut into the tape, the backing tape 22 of the double-sided sputtering tape 15 is removed, ready for receiving the IC units.

Figure 3:
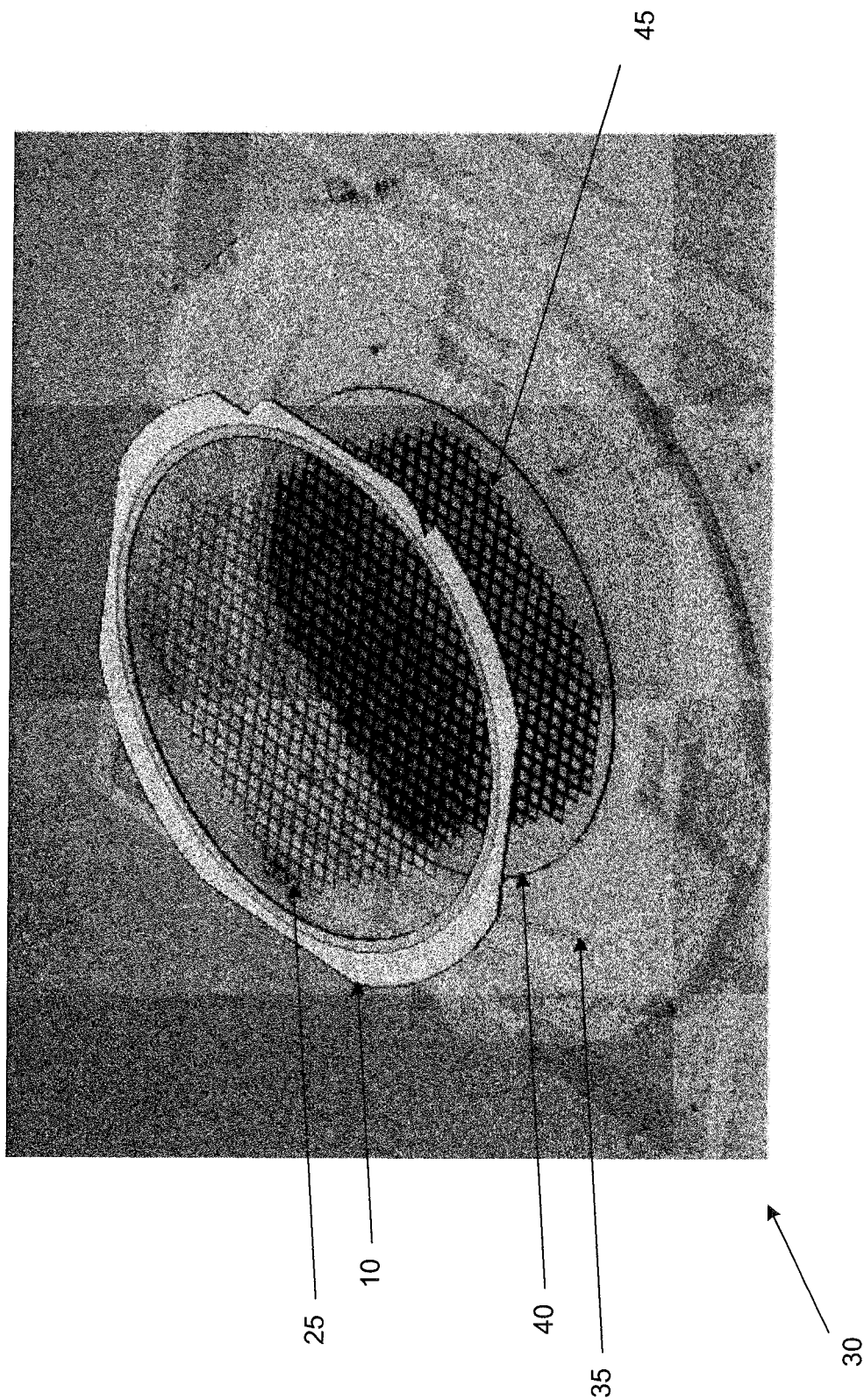
FIGS. 3 and 4 are sequential views of the application of a holding ring to a template according to a further embodiment of the present invention.
Figure 4:
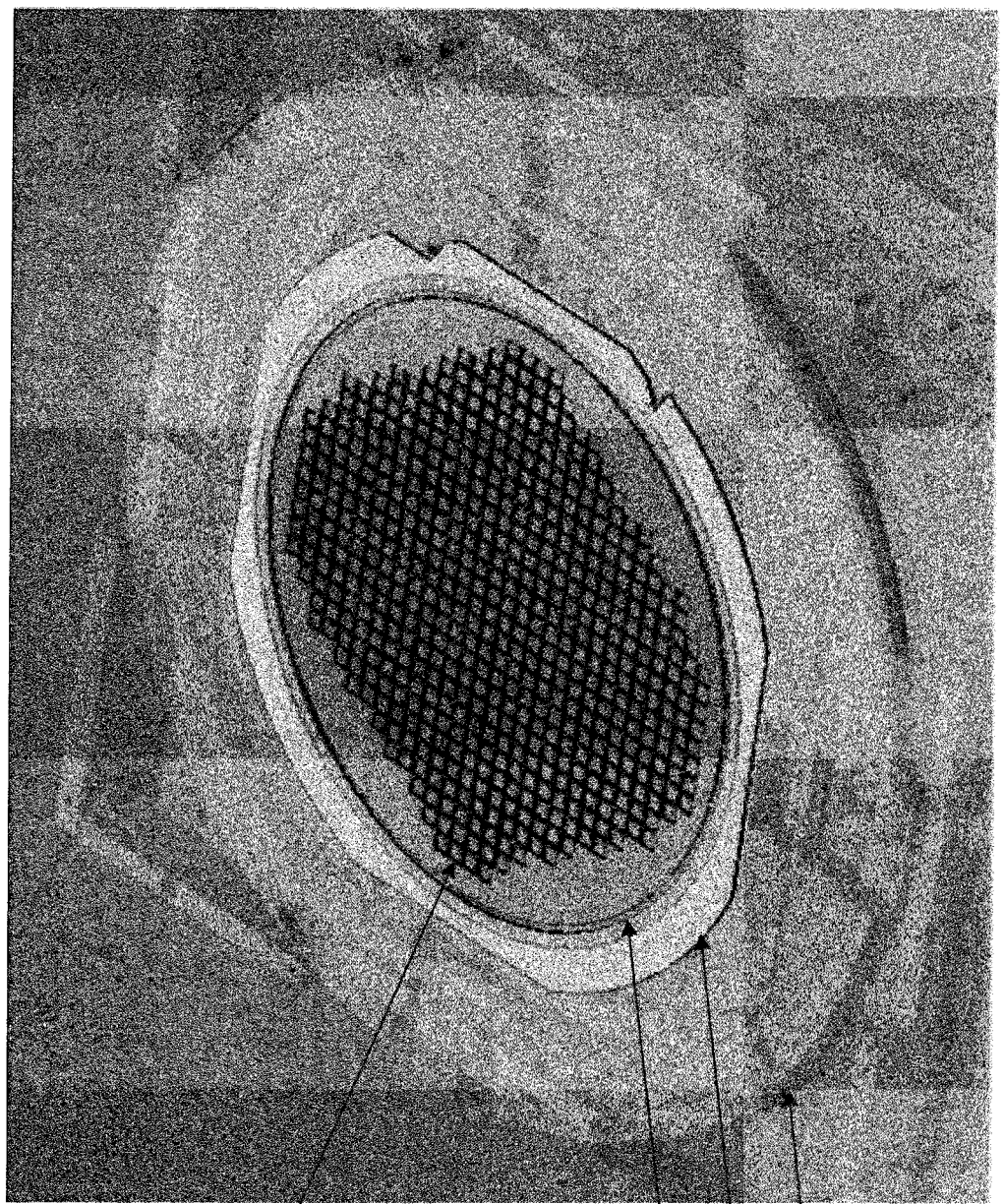

FIGS. 3 and 4 shows the next step in the process involving a placement station 30. The ring 10 having the laser cut apertures 25 in the sputtering tape and sub-tape is lowered onto the placement table 35. In this embodiment, the placement table 35 includes a template 40 having an array of recesses 45 corresponding to the laser cut apertures 25 in the sputtering tape that are aligned as the holding ring 10 is lowered onto the template. Thus, the template 40 takes the place of the stencil during the placement process without the need for an individual stencil prior to or following sputtering. The cost savings in replacing the stencil with the template 40 is therefore significant as the template 40 can be reused for each placement process as compared to the stencil that is subsequently discarded.

Figure 5:
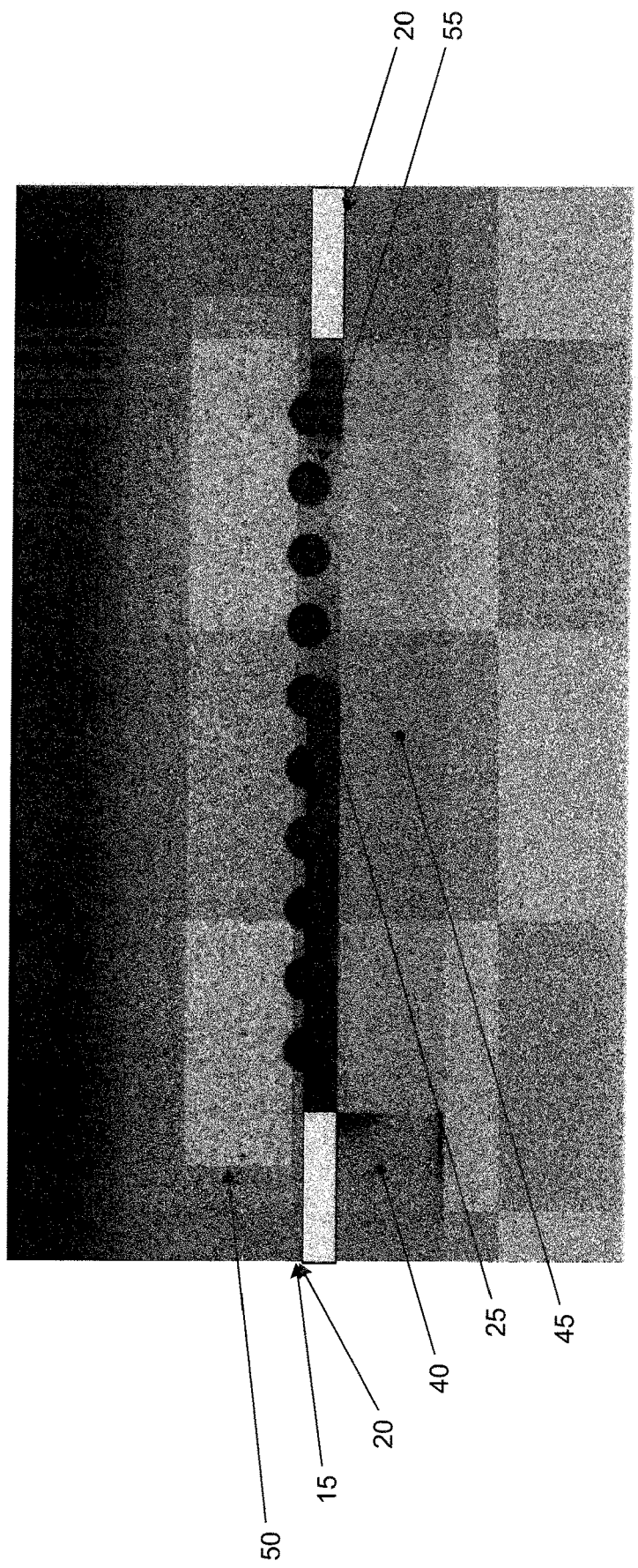
FIG. 5 is an elevation view of a unit positioned within an aligned aperture of a laser cut layer and recess of a template according to a further embodiment of the present invention.

FIG. 5 shows the ring 10 in place over the template 40 with the IC units 50 placed on the sputtering tape 15 over the template recesses 45 and thus aligning the apertures 25 as previously described. The units 50 are engaged by a picker to move the units to the template and inspecting the underside of the units during delivery by the picker. The IC units in this case are BGA chips, which are positioned on the adhesive surface of the sputtering tape 15, which fits over the template 40. The BGA chip 50 includes solder ball connections 55 around the chip 50 that fit within the void created by the alignment of the recesses 45 and apertures 25.

What is claimed is:

1. A process for sputtering a plurality of integrated circuit ("IC") units, the process comprising the steps of:
   applying an adhesive layer and a sub-tape to a holding ring of a placement station, such that the sub-tape is arranged to be attached underneath the adhesive layer;
   cutting an array of apertures in the adhesive layer and the sub-tape;
   transferring the holding ring to a template positioned within the placement station;
   aligning said array of apertures with an array of recesses in said template;
   delivering IC units to said holding ring, each IC unit corresponding to an aligned aperture and recess, and
   applying a sputtering process to said IC units engaged with said holding ring.

2. The process according to claim 1, wherein the cutting step comprises laser cutting.

3. The process according to claim 2, wherein the delivering step including engaging the IC units with a picker and disengaging them to transfer to the holding ring.

4. The process according to claim 3, wherein the adhesive layer is a double-sided tape.

5. The process according to claim 4, wherein the cutting step includes cutting the double-sided tape and then peeling a backing tape of the double-sided tape to expose an adhesive surface and remove the cut portions of the double-sided tape.

6. The process according to claim 1, wherein the delivering step includes engaging the IC units with a picker and disengaging them to transfer to the holding ring.

7. The process according to claim 1, wherein the adhesive layer is a double-sided tape.

8. A placement station comprising:
   a template having an array of recesses; and
   a holding ring, arranged for being received on the template, having an adhesive layer and a sub-tape, each of which has an array of apertures, the sub-tape arranged to be attached underneath the adhesive layer;
   wherein the respective arrays of apertures and recesses are arranged to align so as to receive a plurality of integrated circuit ("IC") units for sputtering.

9. The placement station according to claim 8, wherein the IC units are ball grid array ("BGA") chips, said apertures sized to allow solder ball connections of the BGA chips to pass through the aperture but retain the IC portion of the BGA chip.

10. The placement station according to claim 9, wherein the adhesive layer is a double-sided tape.

11. The placement station according to claim 10, wherein the adhesive layer further has a peripheral adhesive portion sufficient to stick to the holding ring.

\* \* \* \* \*